United States Patent [19]

Barzynski et al.

[11] 4,239,609

[45] Dec. 16, 1980

[54] PHOTOPOLYMERIZABLE COATING AND RECORDING MATERIALS CONTAINING A PHOTOINITIATOR AND AN ORGANIC HALOGEN COMPOUND

[75] Inventors: Helmut Barzynski, Bad Duerkheim; Dietrich Saenger, Frankenthal, both of Fed. Rep. of Germany

[73] Assignee: BASF Aktiengesellschaft, Fed. Rep. of Germany

[21] Appl. No.: 974,622

[22] Filed: Dec. 27, 1978

[30] Foreign Application Priority Data

Dec. 31, 1977 [DE] Fed. Rep. of Germany ....... 2759164

[51] Int. Cl.$^3$ .............................................. C08F 2/50
[52] U.S. Cl. ......................... 204/159.23; 204/159.18; 430/286
[58] Field of Search ...................... 204/159.18, 159.23; 96/115 P

[56] References Cited

U.S. PATENT DOCUMENTS

| | | | |
|---|---|---|---|
| 3,857,769 | 12/1974 | McGinniss | 204/159.24 |
| 3,878,075 | 4/1975 | McGinniss | 204/159.23 |
| 3,988,228 | 10/1976 | Newland et al. | 204/159.23 |
| 4,040,923 | 8/1977 | Pacifici et al. | 204/159.15 |
| 4,043,887 | 8/1977 | Pacifici et al. | 204/159.23 |
| 4,113,592 | 9/1978 | Rybny et al. | 204/159.16 |

*Primary Examiner*—John C. Bleutge
*Attorney, Agent, or Firm*—Keil & Witherspoon

[57] ABSTRACT

Photopolymerizable coating and recording materials, such as photopolymer dry film resist materials and photoresist materials, comprising at least one photopolymerizable olefinic compound, which materials contain, as activated photoinitiator system, a carbonyl compound that, when exposed to actinic light, forms free radicals which initiate polymerization, such as benzophenone and benzophenone derivatives, as well as a benzene compound having at least two dichloromethyl groups bound to the benzene nucleus, such as bis(dichloromethyl)-benzene and 2,5-dichloro-1,4-bis(dichloromethyl)-benzene, and preferably also a dye which changes color in the presence of acid. The coating and recording materials of the invention exhibit improved curing when exposed to ultraviolet light for the usual periods and can be readily washed out with solvents without any damage to the exposed areas.

5 Claims, No Drawings

PHOTOPOLYMERIZABLE COATING AND RECORDING MATERIALS CONTAINING A PHOTOINITIATOR AND AN ORGANIC HALOGEN COMPOUND

The present invention relates to photopolymerizable coating and recording materials comprising at least one photopolymerizable olefinically unsaturated organic compound, which materials contain, in order to improve their curing characteristics when they are exposed to actinic light, specific organic halogen compounds in addition to at least one photoinitiator. The materials of the invention are particularly suitable for the production of printing plates, photopolymer dry film resist materials and photopolymeric silver-free photographic films.

Photopolymerizable coating and recording materials for the said applications are known per se, and a number of chemical compounds for improving curing thereof by irradiation with ultraviolet light have already been described in the literature. A disadvantage which frequently occurs in the case of the prior art coating and recording materials which are solid at room temperature is that the rate of polymerization, induced by irradiation with actinic light, in the case of highly viscous compositions decreases considerably toward the end of the reaction, as a result of which virtually complete polymerization or crosslinking of the olefinically unsaturated bonds is not possible in the usual exposure times. Consequently, such coating and recording materials must in practise be exposed for too long a period, particularly when the non-exposed areas have to be washed out with a solvent after imagewise exposure or when the surface tackiness of the photosensitive layer or the adherence thereof to the flat support varies with the degree of photopolymerization.

It is known from German Laid-Open Application (DOS) No. 19 47 194 and U.S. Pat. Nos. 4,040,923 and 4,043,887 that benzophenone derivatives which have chlorinated or brominated methyl groups on the aromatic rings, such as 4-chloromethylbenzophenone, 3,4- or 4,4'-bis(chloromethyl)benzophenone, and 4,4'-bis(bromo-methyl)benzophenone, can be used as photoinitiators for photopolymerizable compounds. The photosensitivity of such systems is however not satisfactory. They also have the disadvantage that the ratio of photoinitiator to activator cannot be varied. German Laid-Open Application (DOS) No. 24 04 156, U.S. Pat. Nos. 3,933,682 and 3,966,573 and Belgian Pat. No. 853,935, disclose that a mixture of (a) acyloins or aromatic ketones, (b) an N—, P—, As—, Bi— or Sb-containing compounds, e.g. an amine, phosphine or arsine, and (c) a halogenated aliphatic, alicyclic or aromatic hydrocarbon can be employed as photoinitiator system. However, the storage stability of recording materials containing these systems is frequently unsatisfactory. Moreover, when compounds (b) which are basic, e.g. amines, are uses it is sometimes not possible to distinguish exposed areas from unexposed areas when a conventional dye is used.

An object of the present invention is to provide a photoinitiator/activator system for photopolymerizable coating and recording materials comprising at least one photopolymerizable olefinically unsaturated organic compound, especially such photopolymerizable coating and recording materials which are solid at room temperature, which system improves curing in the normal exposure times and enables the materials to be readily washed out with solvents without any damage to the exposed areas, i.e. does not have the disadvantages of the said prior art systems at all or has them only to a slight extent.

We have found that photopolymerizable coating and recording materials comprising at least one photopolymerizable olefinically unsaturated organic compound which contain, as activated photoinitiator system, (a) at least one aromatic carbonyl compound that, when exposed to actinic light, forms free radicals which initiate polymerization, and (b) a halogenated hydrocarbon exhibit the desired improvements if a benzene compound having at least two dichloromethyl groups bound to the benzene nucleus is used as halogenated hydrocarbon (b).

Perferably, the coating and recording materials of the invention also contain a dye which changes color in the presence of acid.

Suitable benzene compounds, contained according to the invention in the activated photoinitiator system, which have at least two dichloromethyl groups ($-CHCl_2$) bound to the benzene nucleus are benzene compounds of the formula

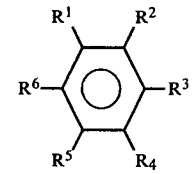

where at least two of the substituents $R^1$ to $R^6$ denote $-CHcl_2$ and the other substituents may be identical or different, provided that they behave inertly toward the dichloromethyl groups, do not interfere with the photopolymerization and do not exhibit high absorption in the range of actinic light, i.e. their decadic absorptivity should preferably be in a wavelength range λ which is from 315 to 400 nm less than $20[liter \times mol^{-1} \times cm^{-1}]$. The said other substituents are preferably hydrogen, halogen, particularly chlorine, hydrocarbon radicals of 1 to 10 carbon atoms, halogenated alkyls of 1 to 10 carbon atoms or optionally halogenated alkoxyls of 1 to 10 carbon atoms. Very suitable benzene compounds having dichloromethyl groups are bis(dichloromethyl)benzenes such as 1,4-bis(dichloromethyl)benzene and 2,5-dichloro-1,4-bis(dichloromethyl)benzene.

The amount of dichloromethylbenzene compound (activator (b)) added is generally from 0.2 to 12 parts by weight per part by weight of photoinitiator (a), it being essential that the amount of activator should be at least 0.5% by weight of the whole composition.

Suitable aromatic carbonyl compounds (a) that, upon exposure to actinic light, form free radicals which initiate polymerization are conventional aromatic carbonyl compounds used as photoinitiators, e.g. aromatic aldehydes and aromatic ketones. Reference is made in particular to the compounds specified in the abovementioned U.S. Pat. No. 3,933,682, col. 1, line 35, to col. 2, line 19, and those described by B. J. Kosar in "Light Sensitive Systems", J. Wiley, New York, 1965, pages 138 to 193; these compounds may also be used in admixture with one another or in admixture with other photoinitiators. Particular mention may be made of benzophenone and substituted benzophenones, such as Michler's ketone, benzoin ethers, such as benzoin isopropyl ether, ethers of benzoins substituted in the α-position by a hydroxyalkyl of 1 to 8 carbon atoms, an alkoxyalkyl of 2 to 8 carbons or a hydrocarbon radical of 1 to 7 carbon atoms, e.g. α-hydroxymethylbenzoin methyl ether, benzil ketals, e.g. benzil dimethyl ketal, anthraquinone and derivatives thereof, thioxanthone and derivatives thereof, and mixtures of benzophenone with derivatives thereof, and of benzophenone derivatives, such as a mixture of benzophenone and Michler's ketone. The suitability of a specific initiator or initiator mixture can, with a knowledge of this invention, be rapidly ascertained by means of a few simple experiments.

Suitable materials comprising at least one photopolymerizable olefinically unsaturated organic compound are conventional photopolymerizable compositions employed for the production of coatings, printing plates, photoresist materials, photopolymer dry film resist materials, photopolymeric silver-free photographic films, etc. They contain olefinically unsaturated organic compounds in the form of olefinically unsaturated monomers, prepolymers or polymers having olefinically unsaturated carbon-carbon double bonds. The olefinically unsaturated compounds should have at least one terminal

group and a boiling point of more than 100° C. at atmospheric pressure and be capable of forming polymers in photoinitiated polymerization reactions. Suitable compositions are described for example in U.S. Pat. Nos. 2,760,863 and 3,966,573; German Published Application (DAS) No. 16 22 297; German Laid-Open Applications (DOS) No. 15 22 444 and 22 15 090; and Belgian Pat. No. 560,154. The photoinitiator/activator system of the invention can be used with particular advantage in photopolymerizable compositions which are solid at room temperature prior to curing (exposure) or which form a solid mass at room temperature after reaction of about 50% of the photopolymerizable olefinically unsaturated carbon-carbon double bonds, i.e. in compositions which exhibit a high viscosity during the last stage of curing and consequently restrict the mobility of the reactants.

Preferred compositions contain, in addition to photopolymerizable monomers, polymeric products as binder component. The organic polymeric binders should be compatible with the monomers present and, as is evident to those skilled in the art, should be soluble or dispersible in the developer solution to permit washout of the unexposed and non-crosslinked areas of a layer of the photopolymerizable compositions in the event of imagewise exposure. Examples of suitable polymeric saturated or olefinically unsaturated binders are linear polyamides and especially alcohol-soluble copolyamides such as are described in French Pat. No. 1,520,856, cellulose derivatives, especially those which can be washed out with aqueous alkaline solutions, vinyl alcohol polymers and polymers and copolymers of vinyl esters of aliphatic monocarboxylic acids of 1 to 4 carbon atoms, e.g. of vinyl acetate, which have been hydrolyzed to various degrees, homopolymers and copolymers of N-vinylpyrrolidone, vinyl chloride or styrene, polyurethanes, polyether-urethanes, polyester-urethanes, polyester resins, acrylate and methacrylate copolymers, such as copolymers of methyl methacrylate with acrylic acid, methacrylic acid, acrylamide and/or hydroxyalkyl acrylates or methacrylates, and elastomeric diene homopolymers and copolymers, e.g. block copolymers comprising butadiene and/or isoprene homopolymer blocks and styrene or α-methylstyrene polymer blocks.

Of the non-polymeric compounds having at least one photopolymerizable olefinically unsaturated double bond, monomers having two or more olefinically unsaturated photopolymerizable double bonds are preferred; these monomers may be used alone or in admixture with monomers having only one olefinically unsaturated photopolymerizable double bond. The type of monomers used depends substantially on the intended use of the coating or recording material and on the type of polymeric binder employed. For example, in the case of mixtures with unsaturated polyester resins, particularly suitable monomers are allyl compounds containing two or more double bonds, e.g. diallyl maleate, allyl acrylate, diallyl phthalate, diallyl and triallyl trimellitate and ethylene glycol bis-allylcarbonate, as well as diacrylates and polyacrylates, and dimethacrylates and polymethacrylates, which may be obtained by esterifying diols or polyols with acrylic acid or methacrylic acid, e.g. the diacrylates and triacrylates, or dimethacrylates and trimethacrylates, of ethylene glycol, diethylene glycol, triethylene glycol, polyethylene glycol having a molecular weight of up to about 500, 1,2-propanediol, 1,3-propanediol, neopentylglycol (2,2-dimethyl-propanediol), 1,4-butanediol, 1,1,1-trimethylolpropane, glycerol and pentaerythritol, as well as the monoacrylates and monomethacrylates of such diols and polyols, e.g. ethylene glycol, diethylene glycol, triethylene glycol and tetraethylene glycol monoacrylate, and monomers containing two or more olefinically unsaturated bonds and also containing urethane groups and/or amide groups, e.g. the non-polymeric compounds obtained from aliphatic diols of the above type, organic diisocyanates and hydroxyalkyl acrylates or methacrylates. Further suitable monomers are acrylic acid, methacrylic acid and their derivatives, e.g. acrylamide, methacrylamide, N-hydroxymethyl-acrylamide, N-hydroxy-methyl-methacrylamide and acrylates and methacrylates of monoalcohols of 1 to 6 carbon atoms. Mixtures of allyl monomers with diacrylates or polyacrylates are very suitable. If mixtures containing a polyamide as the polymeric binder are selected, particularly suitable monomers, amongst the types mentioned, are the diacrylates and polyacrylates, and monomers which in addition to the double bonds contain amide and/or urethane groups, for example acrylamide derivatives, e.g, the reaction products of 2 moles of N-hydroxymethyl-acrylamide or N-hydroxymethyl-methacrylamide with 1 mole of an aliphatic diol, e.g. ethylene glycol, xylylene-bis-acrylamide or alkylene-bis-acrylamides where alkylene is of 1 to 8 carbon atoms, Water-soluble monomers, e.g. hydroxyethyl acrylate, hydroxyethyl methacrylate and monoacrylates, diacrylates, monomethacrylates and dimethacrylates of polyethylene glycols having a molecular weight of from about 200 to 500, are particularly suitable for the production of printing plates which contain polyvinyl alcohol as polymeric binder and can be developed with aqueous alkaline solutions.

The amounts of monomers and polymeric binder can be varied within wide limits and are generally from 10 to 55%, especially from 25 to 50%, by weight and from 45 to 90%, especially from 50 to 75, by weight respectively, based on the sum of the amounts of monomers and polymeric binder.

The amount of added activated photoinitiator system consisting of photoinitiator(s) (a) and activator (b) in the above relative proportions is in general from 1 to 25% by weight and particularly from 2 to 20% by weight, based on the total weight of the coating or recording material, i.e. the sum of the weights of all components. The amount of photoinitiator used depends on its absorptivity and on the thickness of the layer of material being cured and is in general from 0.5 to 10% by weight and especially from about 1 to 5% by weight, based on the total weight of the coating or recording material. The amount of activator (b) should be at least 0.5% by weight and is in particular from about 1 to 12% by weight, based on the total weight of the composition; it is governed by the desired curing characteristics of the layer of material. It has frequently proved advantageous in the case of relatively thick layers to use less photoinitiator to avoid the marked absorption of ultraviolet radiation, the amount of activator being unchanged.

Apart from the photopolymerizable compounds, polymeric binders, photoinitiators and activators, the coating and recording materials of the invention may contain conventional additives in the usual amounts, such as inorganic or organic pigments or dyes, inorganic or organic fillers, polymerization inhibitors, such as hydrquinone and tert-butyl hydroquinone, anti-skinning agents, such as paraffin, flow modifiers, such as silicone oil, flatting agents or lubricants, such as waxes, and organic solvents, such as alcohols, hydrocarbons and ketones.

The coating and recording materials of the invention preferably contain, as dye, a dye which changes color in the presence of acid, in an amount generally from 0.05 to 2% by weight, e.g. 3'-phenyl-7-diethylamino-2,2'-spirodi(2H-1-benzopyrone), bromocresol green and methyl orange. Dyes which do not have such amino groups and form salts with acids while deepening in shade are very suitable.

The photopolymerization is generally initiated with light having a wavelength of from 2,300 to 4,500 Å, and especially with light having emission maxima at from 3,000 to 4,200 Å. Suitable sources of radiation are high-pressure mercury vapor lamps, superactinic fluorescent tubes, pulsed xenon lamps, metal iodide-doped lamps, and carbon arc lamps.

The materials of the invention can be processed in the conventional manner into coatings, UV-curing printing inks and print pastes, photopolymer printing plates, photoresists, photopolymer dry film resist materials and photopolymeric silver-free photographic films.

It is suprising that the benzene compounds (b) having specific dichloromethyl groups which are contained according to the present invention in the compositions have such a marked activating effect, while exhibiting very good compatibility with a large number of binders and monomers, and an astonishing degree of chemical inertness, as compared with, for example, the structurally similar benzal chloride. Silver chloride is not precipitated by the addition of silver nitrate to a solution of dichloromethyl-containing benzene compounds (b) in methanol in the presence of water. Since activators (b) absorb hardly any light above 310 nm, they do not interfere with the absorption of photoinitiators or dyes. The parts and percentages given in the following Examples and Comparative Examples are by weight, unless stated otherwise. Parts by weight bear the same relation to parts by volume as the kilogram to the liter.

COMPARATIVE EXAMPLE 1

A photopolymer letterpress printing plate is produced as described in Example 1 of U.S. Pat. No. 3,615,629, and is exposed for different periods of time through a test negative (48 lines/cm) used in reproduction work in a commercial printing plate exposure unit equipped with eight 20 W low-pressure fluorescent tubes. After storing for 24 hours, the unexposed areas of the printing plate are washed out as disclosed in the said Example. Table 1 gives the exposure times required to reproduce a 3% highlight dot in the relief.

EXAMPLE 1

The procedure of Comparative Example 1 is followed, except that 5 parts of 1,4-bis(dichloromethyl)-benzene is mixed into the viscous solution used in the production of the letterpress plate. The results of the exposure tests are also given in Table 1.

TABLE 1

| Reproduction of 3% highlight dot in dependence on the exposure time | | | | | |
|---|---|---|---|---|---|
| | Exposure time (min) | | | | |
| Printing plate | 2 | 3 | 4 | 6 | 8 |
| Comparative Example 1 | − | − | + | + | ++ |
| Example 1 | − | + | ++ | ++ | ++ |

− = inadequate;
+ = satisfactory;
++ = good

COMPARATIVE EXAMPLE 2

A solution of 60 parts of a copolymer of 70% of methyl methacrylate, 5% of 2-ethylhexyl acrylate, 5% of styrene and 20% of methacrylic acid (produced by solution polymerization in ethyl acetate using azodiisobutyronitrile as polymerization initiator), 25 parts of pentaerythritol tetraacrylate, 5 parts of 1,6-hexanediol dimethacrylate, 2 parts of Michler's ketone, 2.5 parts of benzophenone, 0.2 part of hydroquinone monomethyl ether and 0.5 part of disperse blue 148 in 300 parts of ethyl acetate to split up into two portions (A, B). Portion A is applied, by dipping, to commercially available, anodically roughened sheets of aluminum in such a way that, after drying, a layer 0.006 mm thick is obtained. A 6 μm thick polyvinyl alcohol layer is subsequently applied from aqueous solution, likewise by dipping, and dried. The resulting offset printing plate is exposed over its entire surface through a 14-step wedge, used in reproduction work, which had a minimum optical density of 0.4 at 370 nm; each subsequent step reduced the optical density by 20% of the preceding step. The printing plate, after a sufficiently long exposure time of 65 sec, the photosensitive coating changing color from dark blue to light blue, and, after development with a phosphate buffer solution having a pH of 10, gives good printed copies on a small offset press.

Reproduction of the steps of the wedge using exposure times of from 1 to 10 minutes is also assessed.

EXAMPLE 2

2.5 parts of 2,5-dichloro-1,4-bis(dichloromethyl)benzene is dissolved in portion B of the solution specified in Comparative Experiment 2. Further processing and testing are carried out as described in Comparative Experiment 2. The plates developed after being exposed for 50 seconds give printed copies of the same quality as those obtained in Comparative Experiment 2 (exposure time 65 seconds). Assessment of the reproduction of the steps of the wedge at exposure times of from 1 to 10 minutes showed that, as compared with the printing plates of Comparative Example 2, at the same exposure times in each case two to three more steps are reproduced with the printing plates of this Example.

EXAMPLES 3 and 4

54 parts of a copolymer of 97% of methyl methacrylate and 3% of acrylamide (produced by polymerization in ethyl acetate using benzoyl peroxide as initiator, and having a K value of 24 according to Fikentscher, Cellulosechemie, 13, 60 (1932), measured on a 1% strength solution in ethyl acetate), 38.5 parts of 1,1,1-trimethylolpropane triacrylate, 1.5 parts of divinylethyleneurea, 2.5 parts of benzophenone, 0.025 part of N-nitrosodiphenylamine, 0.011 part of crystal violet, 0.3 part of 3'-phenyl-7-diethylamino-2,2'-spirodi(2H-1-benzopyrone), 3.5 parts of a polyester prepared from adipic acid and 1,2-propylene glycol and having a viscosity of 7 $N/m^2 \times sec$ (at 20° C.), 0.3 part of a commercial silicone oil and 1.5 parts of 1,4-bis(dichloromethyl)benzene are dissolved in 140 parts of ethyl acetate. The solution is filtered under pressure through a filter having a pore diameter of 1 μm and cast on a 0.023 mm thick polyester film in such an amount that a photosensitive layer 0.048 mm in thickness is obtained after drying in warm air. The photosensitive layer is covered with a 30 μm thick film of high density polyethylene. The three-layer sandwich is cut to a width of 50 cm, wound onto a paperboard core and stored in the dark in the rolled-up state. Prior to use as a dry film resist, the polyethylene cover sheet is peeled off in a commercial laminator and the resist is laminated onto prebrushed, copper-plated glass-fiber-reinforced epoxy resin boards at 110° C. at a speed of 1 m/min. The boards are cut to the required size and further processed as follows:

EXAMPLE 3

A board is exposed for 1 minute with ultraviolet light through a photographic negative of an electrical circuit, the exposed areas changing in color from bluish violet to dark blue, which gives an excellent contrast. The polyester film is then peeled off and the unexposed areas are washed out with 1,1,1-trichloroethane. Etching is then effected with an iron(III) chloride solution of 44° Bé strength, and the board is rinsed with water and dried. The exposed areas of the resist are subsequently removed by rinsing the board for 1 minute with acetone, and a printed circuit board is obtained.

EXAMPLE 4

A board is exposed for 1 minute with ultraviolet light through a positive transparency of an electrical circuit. The polyester film is then peeled off, the unexposed areas are washed out and a 0.035 mm thick layer of copper, a 0.005 mm thick layer of nickel and a 0.002 mm thick layer of gold are electrodeposited consecutively on the uncovered copper surface. The remaining resist material is subsequently removed by rinsing the board with methylene chloride, and the uncovered copper surface is etched with an ammoniacal copper nitrate solution. A printed circuit board is obtained which exhibits a sharp, well defined relief image.

COMPARATIVE EXAMPLES 3 and 4

A dry film resist is produced as described in Examples 3 and 4, except that no 1,4-bis(dichloromethyl)benzene is added to the solution. If it is desired to obtain results comparable with those of Examples 3 and 4, the exposure time must be increased from 60 seconds to 95 seconds. Furthermore, the exposed areas do not turn dark blue.

EXAMPLES 5 AND 6 AND COMPARATIVE EXAMPLES 5-10

In each case a solution of 53 parts of the copolymer specified in Example 3, 20 parts of trimethylolpropane triacrylate, 10 parts of a reaction product of 1,4-butanediol diglycidyl ether with an equivalent amount of acrylic acid, 6 parts of triethylene glycol diacrylate, 0.5 part of divinylpropyleneurea, 2.5 parts of benzophenone, 0.4 part of Michler's ketone, 0.05 part of 2,6-di-tert-butyl-4-methylphenol, 3.5 parts of tribenzyl phosphate and 0.3 part 3'-phenyl-7-diethylamino-2,2'-spirodi(2H-1-benzopyrone) in 200 parts of ethyl acetate is prepared.

The chlorine compounds listed in Table 2 are mixed into equal portions of the resulting solution, in the amounts specified in the said Table. The 25 different solutions thus obtained are processed into dry film resists as described in Examples 3 and 4 which are then laminated onto copper-plated glass-fiber-reinforced epoxy resin boards and exposed with ultraviolet light through a photographic negative of a printed circuit having conductor lines 0.1 mm in width, the exposure time being in each case only 45 seconds instead of 60 seconds which would normally be required for processing. After storing the exposed laminate for 1 hour and then stripping off the polyester film, development is effected with 1,1,1-trichloroethane, a mechanically driven plush pad continuously effecting circular movements over the circuit image. The minimum developing time required is from 10 to 15 seconds in very case.

The maximum permissible washout time after which the exposed areas are removed from the copper surface is determined for each sample. The results are also given in Table 2 and show particularly clearly the effect that the compounds of the invention have on the photopolymerization. At an exposure time of 1 minute the differences are not so marked; however, even in the case of a tenfold overexposure (600 sec) the effect can still be readily measured.

TABLE 2

Maximum exposure times (min) when employing varying amounts of different chlorine compounds

| | Chlorine compound | 0 parts | 0.5 part | 1 part | 3 parts |
|---|---|---|---|---|---|
| Example 5 | 1,4-bis(dichloromethyl)-benzene | 6.5 | 17 | 26 | 50 |
| Example 6 | 2,5-dichloro-1,4-bis(dichloromethyl)benzene | 6.5 | 18 | 26 | 52 |
| Comp. Ex. 5 | chloroparaffin, technical grade (70% Cl) | 6.5 | 6.5 | 8 | 12 |
| Comp. Ex. 6 | chlorinated biphenyl | 6.5 | 7 | 7 | 12 |
| Comp. Ex. 7 | hexachlorocyclohexane (isomer mixture) | 6.5 | 7 | 8 | 13 |
| Comp. Ex. 8 | p-dichloromethylbenzophenone (no addition of benzophenone) | — | 2 | 5 | 8 |
| Comp. Ex. 9 | hexanediol-1,6-bis(trichloroacetate) | 6.5 | 10 | 13 | 30 |
| Comp. Ex. 10 | 1,4-bis(trichloromethyl)- | | | | |

TABLE 2-continued

Maximum exposure times (min) when employing varying amounts of different chlorine compounds

| Chlorine compound | 0 parts | 0.5 part | 1 part | 3 parts |
|---|---|---|---|---|
| benzene | 6.5 | 10 | 12 | 31 |

EXAMPLE 7

A photosensitive printing ink binder is prepared from 49 parts of the reaction product of 1 mole of hexamethylene diisocyanate and 2 moles of hydroxypropyl acrylate, 20 parts of the reaction product of 1 mole of toluylene diisocyanate and 2 moles of hydroxypropyl acrylate, 8 parts of pentaerythritol tetraacrylate, 3 parts of p,p-bis(diethylamino)benzophenone, 3 parts of p-dimethylaminobenzaldehyde, 4 parts of benzophenone, 3 parts of 4-phenylaminoazobenzene and 10 parts of 2,5-dichloro-1,4-bis(dichloromethyl)benzene.

Five 1.5 μm thick layers of this binder are applied one after the other to copper-plated epoxy resin boards on a modified letterpress printing machine, each layer being exposed for 0.6 second with a 1000 W high-pressure mercury vapor lamp. A commercial photopolymer letterpress plate based on polyamide is used as printing plate, the printing image representing an electrical circuit. After a 7.5 μm thick layer of printing ink has been applied to the boards, drying is carried out for 30 minutes and then the uncovered copper surface is etched with an aqueous iron(III) chloride solution of 44° Bé strength. The conductor boards obtained in a run of 1000 units have a sharp, well-defined relief image, even very fine conductor lines having sharp, straight shoulders, and exhibit very good dimensional accuracy. Deviations from the original pattern are not more than 2 μm, wheras deviations in the case of a long run of conductor boards produced by screen printing are usually up to 25 μm.

COMPARATIVE EXAMPLE 11

A printing ink binder is produced as described in Example 7, except that the 2,5-dichloro-1,4-bis(dichloromethyl)benzene is replaced by the same amount of 1,4-bis(trichloromethyl)benzene. This binder, too, can be used to print circuits by the letterpress method. In this case, however, each layer has be exposed for 1.1 seconds.

EXAMPLE 8

A 20 μm thick coating of the solution of Example 2 is applied to a woven meshed substrate. After imagewise exposure with actinic light and development in aqueous alkaline solution, an excellent screen for screen printing is obtained.

We claim:
1. A photopolymerizable coating and recording material comprising at least one photopolymerizable olefinically unsaturated organic compound and containing, as the activated photoinitiator system,
 (a) at least one aromatic carbonyl compound that, when exposed to actinic light, forms free radicals which initiate polymerization, and
 (b) a halogenated hydrocarbon of the formula

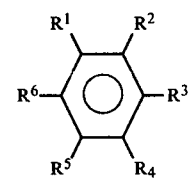

wherein two of the substituents $R^1$ and $R^4$ denote $-CHCl_2$, while the remaining substituents are identical or different and are inert with respect to the dichloromethyl groups, do not interfere with the photopolymerization or with the absorptivity of (b) of less than 20 (liter$\times$mol$^{-1}\times$cm$^{-1}$), at a wavelength range λ of from 315 to 400 nm, the amount of (b) containing dichloromethyl groups being at least 0.5% by weight of the whole composition, and being from 0.2 to 12 parts by weight per part by weight of aromatic carbonyl compound (a).

2. The photopolymerizable coating and recording material of claim 1, wherein a bis(dichloromethyl)benzene is used as halogenated hydrocarbon (b).

3. A photopolymerizable coating and recording material as claimed in claim 1, wherein 2,5-dichloro-1,4-bis(dichloromethyl)benzene is used as halogenated hydrocarbon (b).

4. The photopolymerizable coating and recording material of claim 1, wherein benzophenone or a substituted benzophenone is used as aromatic carbonyl compound (a).

5. The photopolymerizable coating and recording material of claim 1, wherein a dye which changes color in the presence of acid is additionally present.

* * * * *